(12) United States Patent
Chen (10) Patent No.: US 10,763,858 B1
(45) Date of Patent: Sep. 1, 2020

(54) CURRENT MODE LOGIC BUFFER DEVICE FOR SUPPRESSING ELECTROMAGNETIC INTERFERENCE AND SIGNAL GENERATING METHOD THEREOF

(71) Applicant: REALTEK SEMICONDUCTOR CORP., Hsinchu (TW)

(72) Inventor: Tsung-Ming Chen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/576,477

(22) Filed: Sep. 19, 2019

(30) Foreign Application Priority Data

May 8, 2019 (TW) .............................. 108115959 A (51) Int. Cl.
*H03K 19/003* (2006.01)
*H03K 19/0185* (2006.01)

(52) U.S. Cl.
CPC ............. *H03K 19/00361* (2013.01); *H03K 19/018514* (2013.01)

(58) Field of Classification Search
None
See application file for complete search history.

(56) References Cited

U.S. PATENT DOCUMENTS

| 7,848,402 B1* | 12/2010 | Wang ............... H04L 25/03057 333/28 R |
| 7,880,521 B2 | 2/2011 | Okamura et al. |
| 8,410,828 B2 | 4/2013 | Jain |

* cited by examiner

*Primary Examiner* — Jany Richardson
(74) *Attorney, Agent, or Firm* — Birch, Stewart, Kolasch & Birch, LLP (57) ABSTRACT

A current mode logic buffer device for suppressing electromagnetic interference includes two output ports and three or more sets of current mode logic buffers. First, second, and third current mode logic buffers respectively generate first, second, and third clock signals in response to first, second, and third differential input signals. The second differential input signal is delayed by a time difference from the first differential input signal, and the third differential input signal is delayed by the time difference from the second differential input signal. The output ports receive the first clock signal, the second clock signal, and the third clock signal, and output a full clock signal. A signal generating method for suppressing electromagnetic interference is also provided.

9 Claims, 6 Drawing Sheets

CURRENT MODE LOGIC BUFFER DEVICE FOR SUPPRESSING ELECTROMAGNETIC INTERFERENCE AND SIGNAL GENERATING METHOD THEREOF

CROSS-REFERENCE TO RELATED APPLICATION

This non-provisional application claims priority under 35 U.S.C. § 119(a) to patent application Ser. No. 10/811,5959 in Taiwan, R.O.C. on May 8, 2019, the entire contents of which are hereby incorporated by reference.

BACKGROUND

Technical Field

The present invention relates to a current mode logic (CML) buffer circuit, and in particular, to a current mode logic buffer device for suppressing electromagnetic interference applied to a high-speed transmission interface.

Related Art

Since a data transmission rate used for the high-speed transmission interface exceeds the operation frequency of many existing mobile communication devices. Therefore, electromagnetic interference often occurs during communication and the electromagnetic interference originates from a wide variety of sources, such as microprocessors, switch circuits, transmitters, transitory power supply elements, and power supplies, all of which may generate electromagnetic interference. Therefore, mitigating electromagnetic interference is an important issue.

At present, the best way to mitigate electromagnetic interference is to add a metal interface, but this way will increase the cost. In addition, reducing a slew rate of the amplifier output is also a method for mitigating the electromagnetic interference, but this way is a modulation method of waveform shaping. Although electromagnetic interference can be mitigated and energy can be reduced in some frequency bands, harmonics are also generated correspondingly, which will cause damage to electronic circuits.

SUMMARY

As described above, in a transfer device for a high-speed transmission interface, signal transmission of a CK lane also faces a same problem of electromagnetic interference.

In view of this, the present invention provides a current mode logic buffer device for suppressing electromagnetic interference, including two output ports and at least three sets of current mode logic buffers. A first current mode logic buffer has two first input ports, the first current mode logic buffer generating a first clock signal in response to a first differential input signal received by the first input port. A second current mode logic buffer has two second input ports, the second current mode logic buffer generating a second clock signal in response to a second differential input signal received by the second input port, the second differential input signal being delayed by a time difference from the first differential input signal. A third current mode logic buffer has two third input ports, the third current mode logic buffer generating a third clock signal in response to a third differential input signal received by the third input port, and the third differential input signal being delayed by the time difference from the second differential input signal. The two output ports are electrically connected to the first, second, and third current mode logic buffers for receiving the first clock signal, the second clock signal, and the third clock signal and outputting a full clock signal.

The present invention further provides a signal generating method for suppressing electromagnetic interference, applied to a current mode logic buffer device, the signal generating method including: receiving a first differential input signal, and generating a first clock signal in response to the first differential input signal; after each time difference, receiving a second differential input signal, and generating a second clock signal in response to the second differential input signal; and receiving the first clock signal and the second clock signal to output a full clock signal.

In summary, according to some embodiments, the current mode logic buffer device can enable the output full clock signal to generate an effect of approaching to a sine wave output, so as to reduce energy of a harmonic signal, thereby mitigating electromagnetic interference.

DETAILED DESCRIPTION

A current mode logic buffer device for suppressing electromagnetic interference in the present invention is disposed in a transfer device for a high-speed transmission interface, and an entire architecture is described in detail using a high definition multimedia interface (HDMI) as an example.

Figure 1:
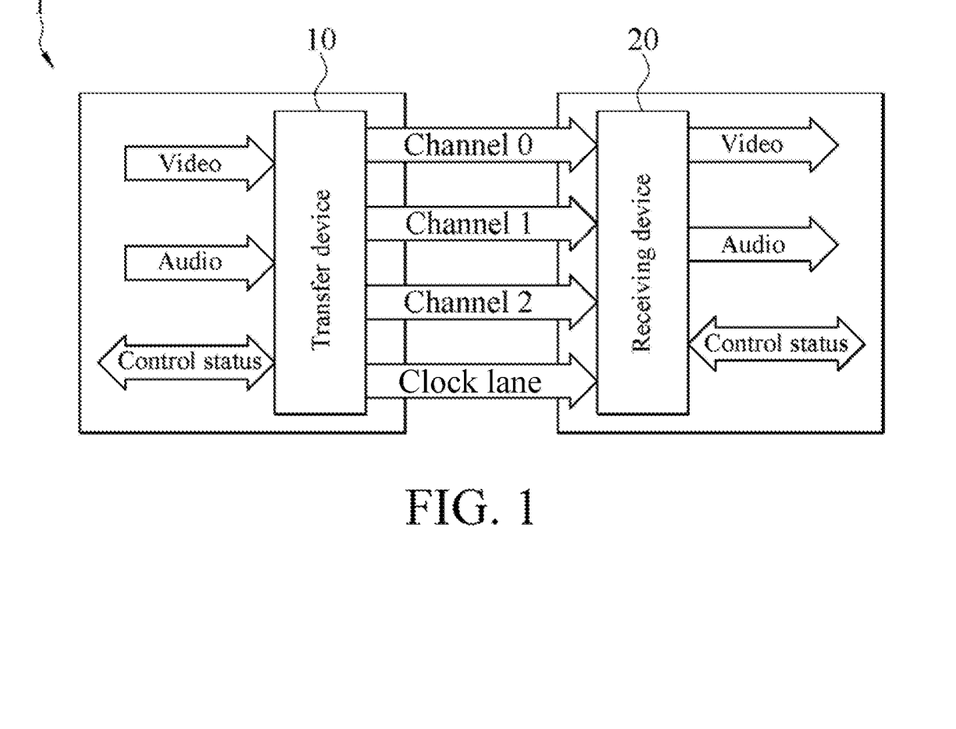
FIG. 1 is a schematic architectural diagram of a general high definition multimedia interface.
Figure 2:
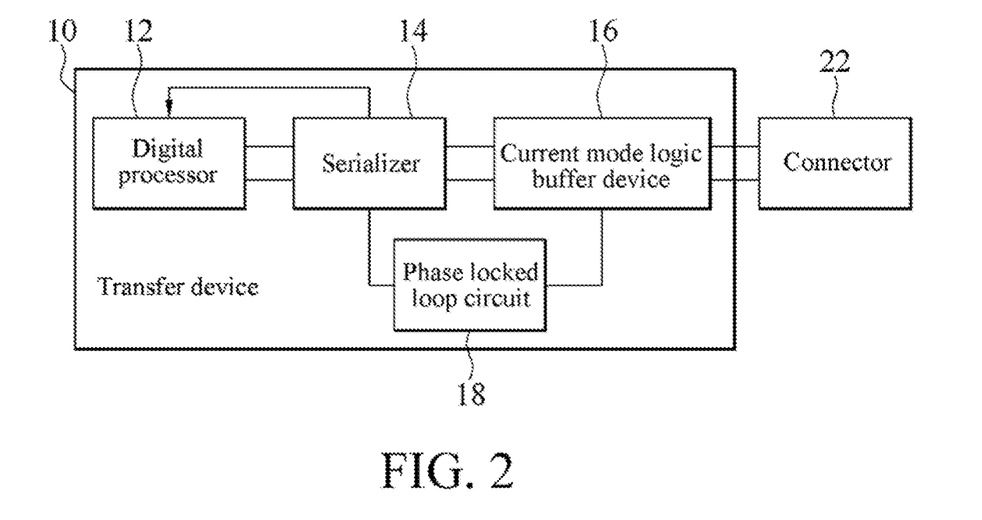
FIG. 2 is a schematic block diagram of a transfer device for a high definition multimedia interface according to an embodiment of the present invention.

FIG. 1 is a schematic architectural diagram of a general high definition multimedia interface, and FIG. 2 is a schematic block diagram of a transfer device for a high definition multimedia interface used in the present invention. Referring to FIG. 1 and FIG. 2, a high definition multimedia interface 1 includes a transfer device 10 and a receiving device 20. The transfer device 10 receives data such as video, audio, and a control status, and transfers the data to the receiving device 20 via three data transmission channels and one clock lane. In some embodiments, the transfer device 10 includes a digital processor 12 electrically connected to a serializer 14, the serializer 14 is electrically connected to a current mode logic buffer device 16, and a phase locked loop (PLL) circuit 18 is electrically connected to the serializer 14 and the current mode logic buffer device 16, so that the phase locked loop circuit 18 provides a clock to the serializer 14 and the current mode logic buffer device 16 for operation. The digital processor 12 is configured to generate 10-bit data for the serializer 14. The serializer 14 serializes a parallel transmission data input signal having a plurality of data paths into a data signal having a single path, and outputs the data signal having a single path to the current mode logic buffer device 16, and then transfers the data signal having a single path to a connector 22 for transmission to an external receiving device 20.

The current mode logic buffer device proposed in the present invention can increase a rising time and a falling time of an output clock signal, to generate an effect of approaching to a sine wave output, and reduce energy of the harmonic signal, thereby mitigating electromagnetic interference.

Figure 3:
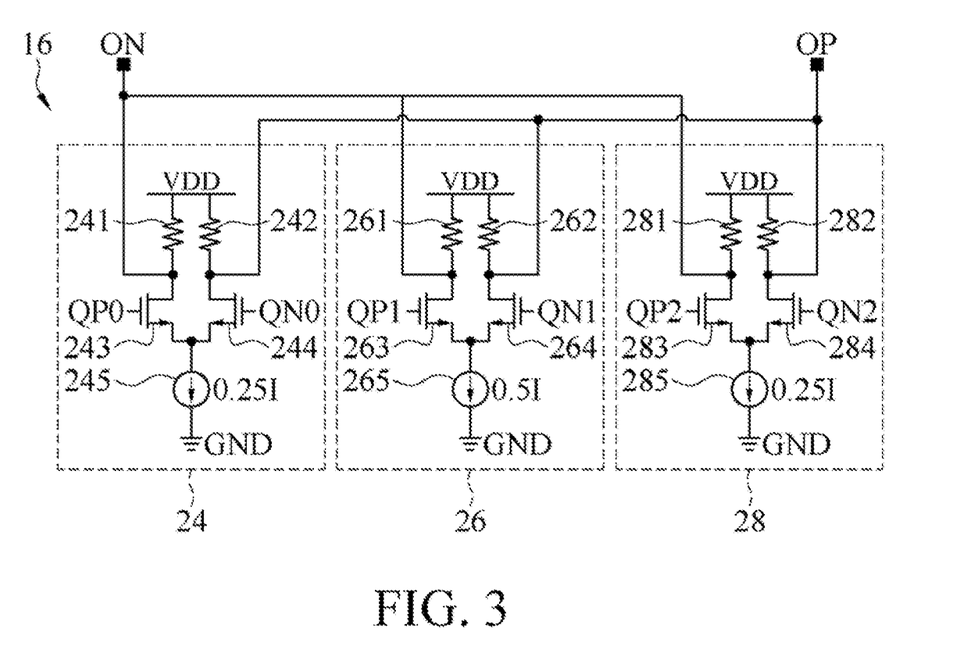
FIG. 3 is a schematic circuit diagram of a current mode logic buffer device according to an embodiment of the present invention.

FIG. 3 is a schematic circuit diagram of a current mode logic buffer device according to an embodiment of the present invention. Referring to FIG. 3, a current mode logic buffer device 16 includes two output ports ON, OP and at least three sets of current mode logic buffers. Three sets of the current mode logic buffers 24, 26, and 28 are used as an example herein, but the present invention is not limited thereto. The two output ports ON, OP are configured to output a full clock signal. The first current mode logic buffer 24 has two first input outputs QP0, QN0 and is electrically connected to the output ports ON, OP. The first current mode logic buffer 24 receives a first differential input signal from the first input ports QP0, QN0, and generates a first clock signal in response to the first differential input signal. The second current mode logic buffer 26 has two second input ports QP1, QN1 and is electrically connected to the output ports ON, OP. The second current mode logic buffer 26 receives a second differential input signal from the second input ports QP1, QN1, and generates a second clock signal in response to the second differential input signal, wherein the second differential input signal is delayed by a time difference from the first differential input signal. The third current mode logic buffer 28 has two third input ports QP2, QN2 and is electrically connected to the output ports ON, OP. The third current mode logic buffer 28 receives a third differential input signal from the third input ports QP2, QN2, and generates a third clock signal in response to the third differential input signal, wherein the third differential input signal is delayed by the time difference from the second differential input signal. The output ports ON, OP receive the first clock signal, the second clock signal, and the third clock signal, and output a full clock signal, that is, the full clock signal consists of at least the first clock signal, the second clock signal, and the third clock signal.

In some embodiments, the foregoing first current mode logic buffer 24 includes two first load resistors 241, 242, two first transistors 243, 244, and a first current source 245. The first load resistor 241 is connected between a voltage supply terminal VDD and a drain terminal of the first transistor 243, and the first load resistor 242 is connected between the voltage supply terminal VDD and a drain terminal of the first transistor 244. Source terminals of the first transistors 243, 244 are jointly connected to one end of the first current source 245, and the other end of the first current source 245 is connected to a ground GND. Gates of the first transistors 243, 244 are respectively connected to the first input ports QP0, QN0, an output port ON is provided between the first load resistor 241 and the first transistor 243, and an output port OP is provided between the first load resistor 242 and the first transistor 244. The first current mode logic buffer 24 has one first differential input signal, and the first differential input signal includes two single-ended input signals that have opposite polarities and that are input from the first input ports QP0, QN0 and applied to the gates of the first transistors 243, 244.

When the first current mode logic buffer 24 operates, the first current source 245 provides a first bias current to be introduced into the first current mode logic buffer 24. In some embodiments, the first current source 245 provides the first bias current using a current mirror. With the first differential input signal that is input from the first input ports QP0, QN0, the first bias current is guided to a left path consisting of the first load resistor 241 and the first transistor 243 and a right path consisting of the first load resistor 242 and the first transistor 243. In some embodiments, when a single-ended input signal input to the first input port QP0 is high (1) and a single-ended input signal input to the first input port QN0 is low (0), in the left path, as a current passing through the first transistor 241 increases, more currents pass through the first load transistor 241, and a signal that is output from the output port ON is low. Meanwhile, in the right path, as a current passing through the first transistor 242 decreases, fewer currents pass through the first load resistor 242, and a signal that is output from the output port OP is high. Similarly, when the single-ended input signal input to the first input port QP0 is low (0) and the single-ended input signal input to the first input port QN0 is high (1), the signal that is output from the output port ON in the left path is high. Meanwhile, the signal that is output from the output port OP in the right path is low. Therefore, the first current mode logic buffer 24 can generate a first clock signal in response to the first differential input signal, and the first clock signal is also a differential signal.

In some embodiments, the foregoing second current mode logic buffer 26 includes two second load resistors 261, 262, two second transistors 263, 264, and a second current source 265. The second load resistor 261 is connected between the voltage supply terminal VDD and a drain terminal of the second transistor 263, and the second load resistor 262 is connected between the voltage supply terminal VDD and a drain terminal of the second transistor 264. Source terminals of the second transistors 263, 264 are jointly connected to one end of the second current source 265, and the other end of the second current source 265 is connected to a ground GND. Gates of the second transistors 263, 264 are respectively connected to the second input ports QP1, QN1, an output port ON is provided between the second load resistor 261 and the second transistor 263, and an output port OP is provided between the second load resistor 262 and the second transistor 264. In an embodiment, the second current source 265 provides a second bias current using a current mirror.

The second current mode logic buffer 26 has a second differential input signal, and the second differential input signal includes two single-ended input signals that have opposite polarities and that are input from the second input ports QP1, QN1 and applied to gates of the second transistor 263, 264. Except that the second differential input signal is delayed by one time difference from the first differential input signal, other operations are the same as the operations of the foregoing first current mode logic buffer 24. Therefore, the second current mode logic buffer 26 can generate a second clock signal in response to the second differential input signal, and the second clock signal is also a differential signal.

In some embodiments, the foregoing third current mode logic buffer 28 includes two third load resistors 281, 282, two third transistors 283, 284, and a third current source 285. The third load resistor 281 is connected between the voltage supply terminal VDD and a drain terminal of the third transistor 283, and the third load resistor 282 is connected between the voltage supply terminal VDD and a drain terminal of the third transistor 284. Source terminals of the third transistors 283, 284 are jointly connected to one end of the third current source 285, and the other end of the third current source 285 is connected to a ground GND. Gates of the third transistors 283, 284 are respectively connected to the third input ports QP2, QN2, an output port ON is connected between the third load resistor 281 and the third transistor 283, and an output port OP is connected between the third load resistor 282 and the third transistor 284. In an embodiment, the third current source 285 provides a third bias current using a current mirror.

The third current mode logic buffer 28 has a third differential input signal, and the third differential input signal includes two single-ended input signals that have opposite polarities and that are input from the third input ports QP2, QN2 and applied to gates of the third transistor 283, 284. Except that the third differential input signal is delayed by two time differences from the first differential input signal (the third differential input signal is delayed by one time difference from the second differential input signal), other operations are the same as the operations of the foregoing first current mode logic buffer 24. Therefore, the third current mode logic buffer 28 can generate a third clock signal in response to the third differential input signal, and the third clock signal is also a differential signal.

Figure 4:
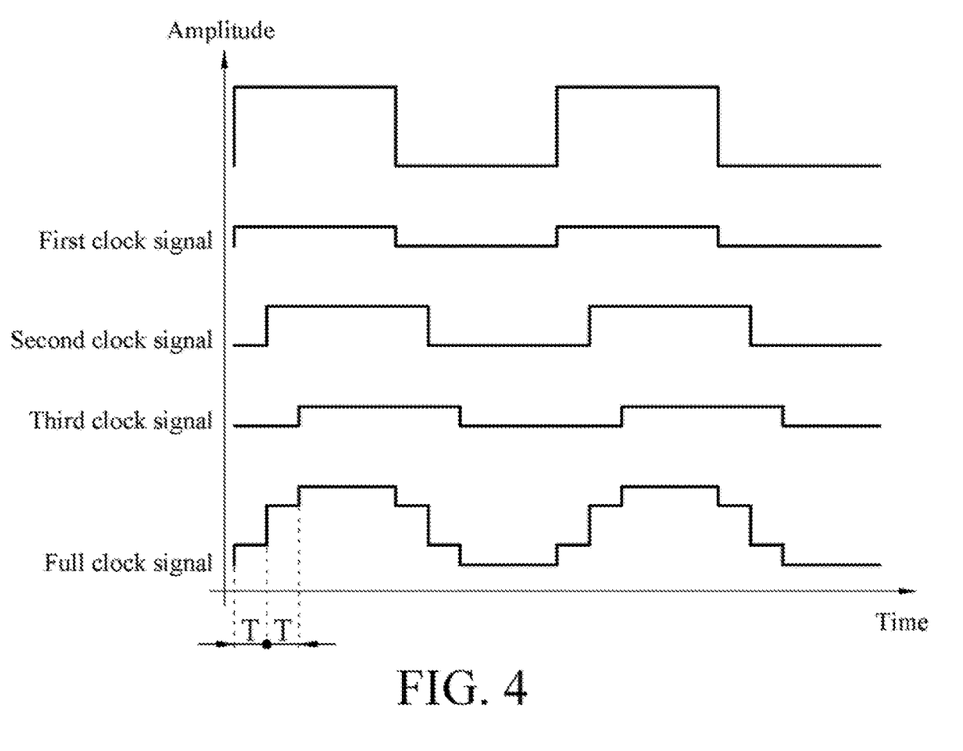
FIG. 4 is a sequence diagram of clock signals generated according to an embodiment of the present invention.

In addition, a voltage level ratio of the foregoing first clock signal to the second clock signal to the third clock signal is equal to a ratio of the first bias current to the second bias current to the third bias current. In an embodiment, the voltage level ratio of the first clock signal to the second clock signal to the third clock signal is 1:2:1. FIG. 4 is a sequence diagram of clock signals generated according to an embodiment of the present invention. Referring to FIG. 3 and FIG. 4 simultaneously, in an embodiment, if a current supplied for the entire current mode logic buffer device 16 is I, according to the foregoing ratio, the first bias current is 0.25 I, the second bias current is 0.5 I, and the third bias current is 0.25 I. In addition, the second differential input signal is delayed by one time difference T from the first differential input signal, and the third differential input signal is also delayed by one time difference T from the second differential input signal. Therefore, as shown in FIG. 4, there is a time difference T among the first clock signal generated by the first current mode logic buffer 24, the second clock signal generated by the second current mode logic buffer 26, and the third clock signal generated by the third current mode logic buffer 28. At this time, the full clock signal output by the current mode logic buffer device 16 is shown in the figure, and the rising time and the falling time of the full clock signal increase due to a delay of the time difference, and therefore, an effect of approaching to the sine wave output can be generated, to reduce the energy of the harmonic signal. In some embodiments, the foregoing time difference T is one tenth of a clock cycle of the full clock signal.

Figure 5:
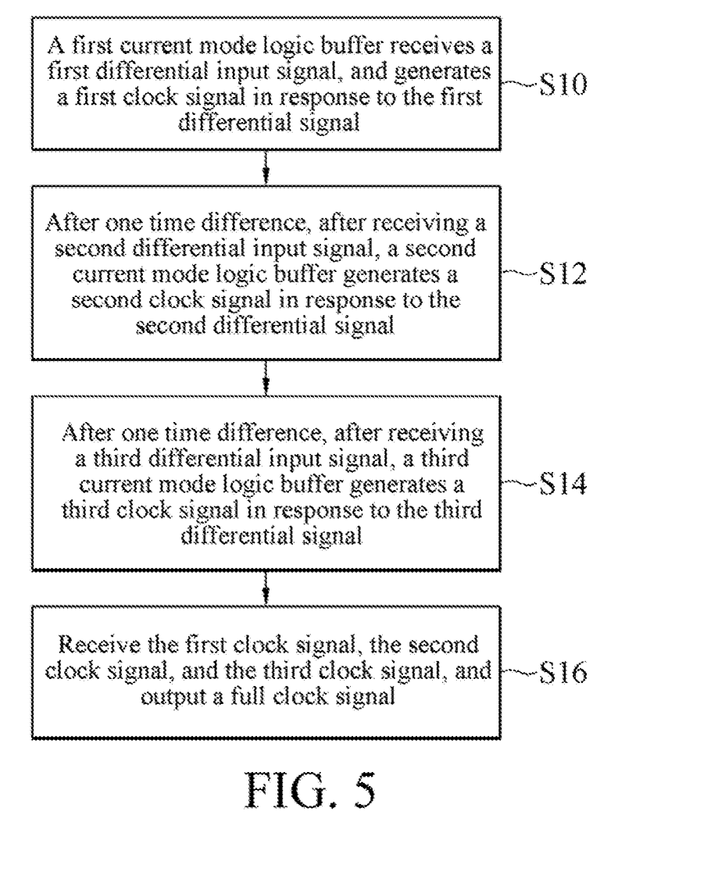
FIG. 5 is a flowchart of a signal generating method according to an embodiment of the present invention.

In the following, a signal generating method of the current mode logic buffer device 16 is described using the three sets of current mode logic buffers 24, 26, and 28 shown in FIG. 3. Referring to FIG. 3 to FIG. 5 simultaneously, first, as shown in step S10, after receiving the first differential input signal, the first current mode logic buffer 24 generates the first clock signal in response to the first differential signal. Then, after each one time difference T, a same operation is performed, that is, as shown in step S12, after one time difference T, after receiving the second differential input signal, the second current mode logic buffer 26 generates the second clock signal in response to the second differential signal. As shown in step S14, after one time difference T again, after receiving the third differential input signal, the third current mode logic buffer 28 generates the third clock signal in response to the third differential signal. Finally, as shown in step S16, when the current mode logic buffer device 16 is to perform outputting, the output ports ON. OP receive the first clock signal, the second clock signal, and the third clock signal to output, from the output ports ON, OP, a full clock signal approaching to a sine wave.

Figure 6:
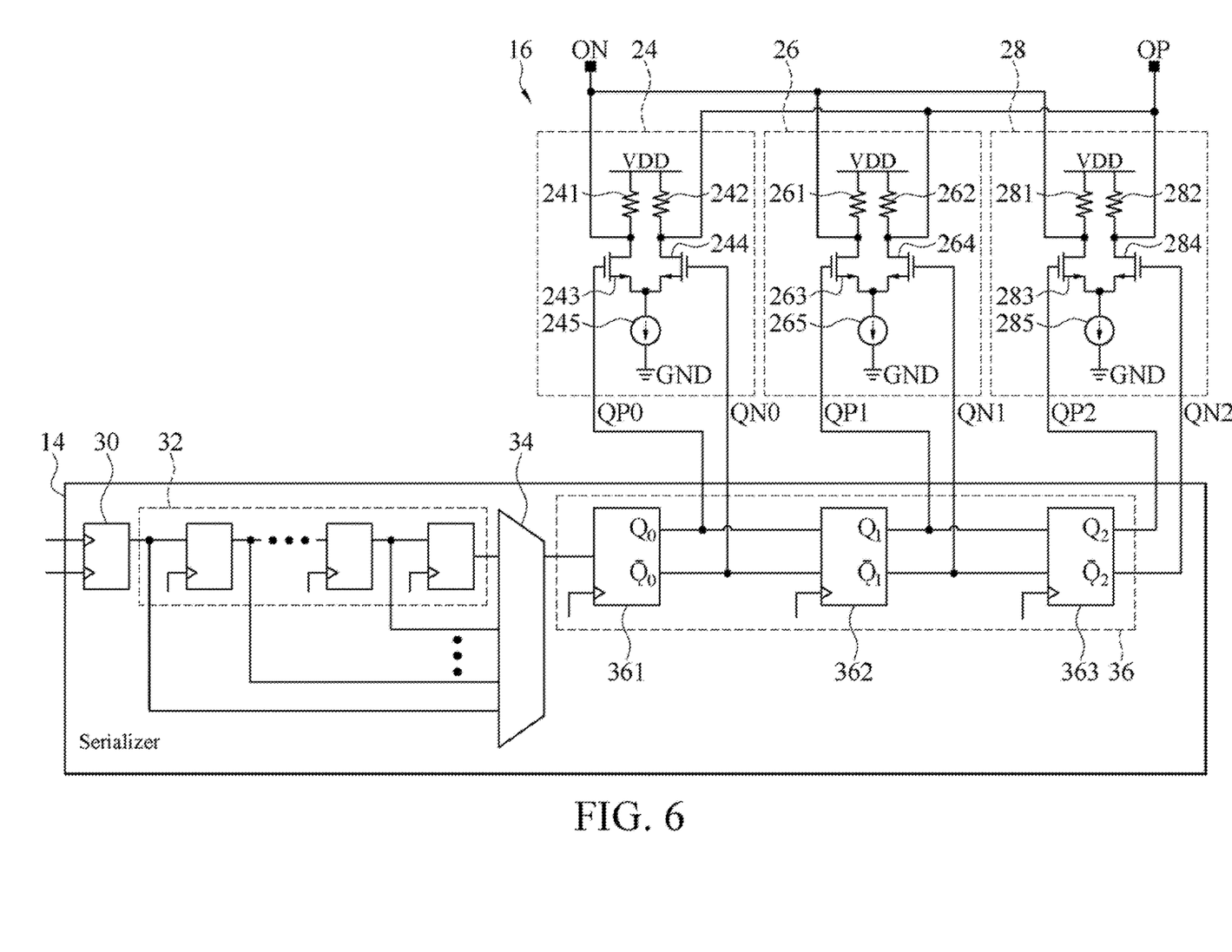
FIG. 6 is a schematic circuit diagram in which a current mode logic buffer device is connected to a serializer according to an embodiment of the present invention.

In some embodiments, the foregoing first differential input signal, the second differential input signal, and the third differential input signal are from a serializer in a transfer device of a high-speed transmission interface. A transfer device for a high definition multimedia interface is used as an example herein, and a serializer of a clock lane may be used directly. As shown in FIG. 6, a shift register 30 can buffer received data effectively, and 10-bit data streams are converted via a flip-flop unit 32 to be transferred to a demultiplexer 34 in parallel. The demultiplexer 34 can serialize data from a plurality of paths to one path effectively and output the data to a high-speed flip-flop (D Flip-Flop) unit 36 sequentially. In the high-speed flip-flop unit 36, first output terminals $Q_0$, $\overline{Q}_0$ of a delay flip-flop 361 are respectively connected to the first input ports QP0, QN0 of the first current mode logic buffer 24, to receive the first differential input signal. Second output terminals $Q_1$, $\overline{Q}_1$ of a delay flip-flop 362 are respectively connected to the second input ports QP1, QN1 of the second current mode logic buffer 26, to receive the second differential input signal. Third output terminals $Q_2$, $\overline{Q}_2$ of a delay flip-flop 363 are respectively connected to the third input ports QP2, QN2 of the third current mode logic buffer 28, to receive the third differential input signal. Since there is one time difference between adjacent ones of the delay flip-flops 361, 362, and 363, the three clock signals (the first clock signal, the second clock signal, and the third clock signal) transferred to the current mode logic buffer device 16 are also generated sequentially with a delay time of one time difference.

Figure 7:
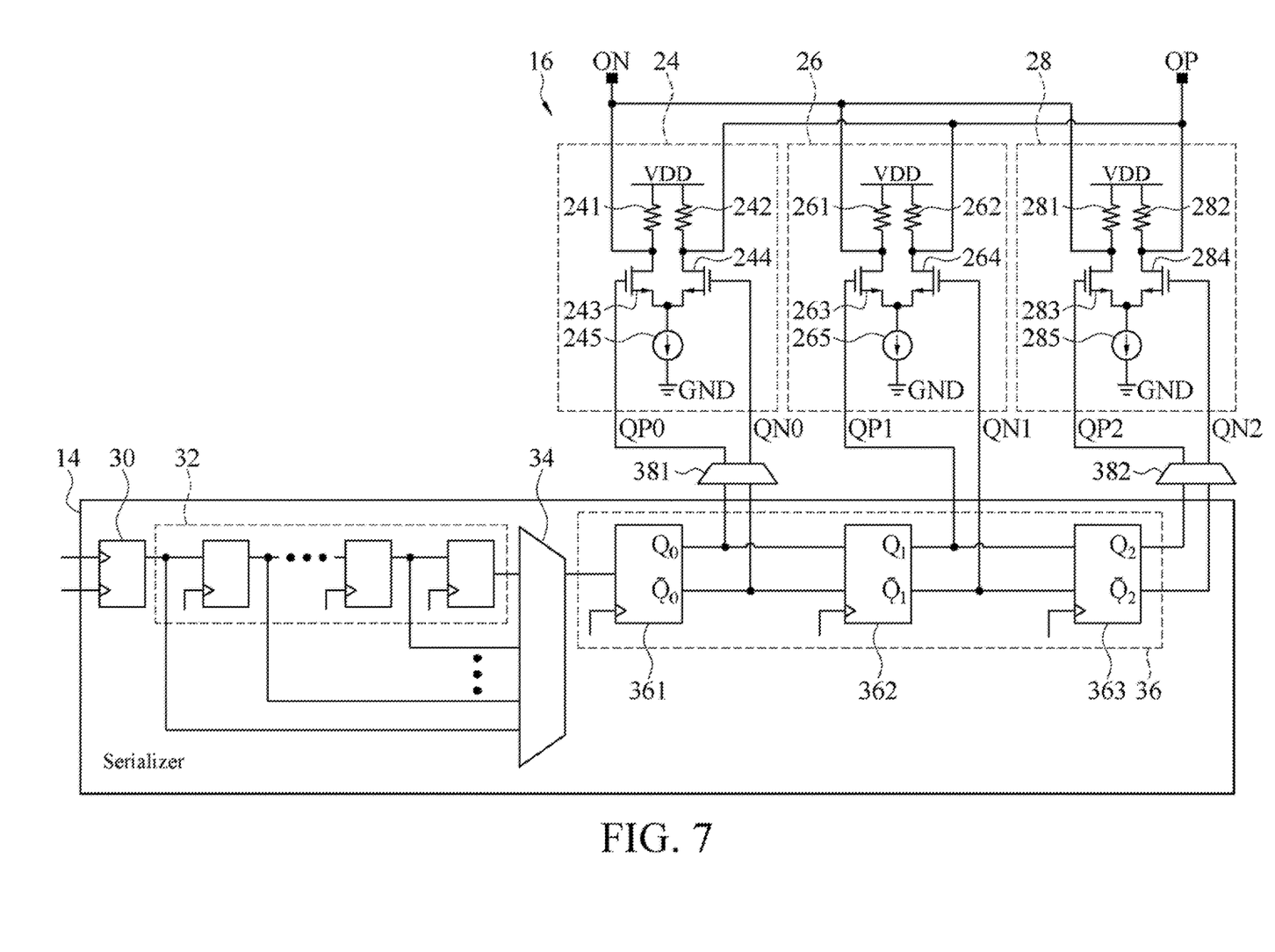
FIG. 7 is a schematic circuit diagram in which a current mode logic buffer device is connected to a serializer according to another embodiment of the present invention.

In the foregoing embodiment, since the current mode logic buffer device of the present invention belongs to a pre-emphasis circuit, a serializer of a clock lane may be used directly. In some embodiments, a serializer of a data lane may also be used for the first differential input signal, the second differential input signal, and the third differential input signal, and as the serializer of the data lane is a de-emphasis circuit, additional inverters 381, 382 are required in some delay flip-flops. Referring to FIG. 7, the first output terminals $Q_0$, $\overline{Q}_0$ of the delay flip-flop 361 are connected to the inverter 381 to invert signals, and then transfer the signals to the first input ports QP0 QN0 of the first current node logic buffer 24 respectively, to receive the first differential input signal. The second output terminals $Q_1$, $\overline{Q}_1$ of the delay flip-flop 362 are also connected to the second input ports QP1, QN1 of the second current mode logic buffer 26 respectively, to receive the second differential input signal. The third output terminals $Q_2$, $\overline{Q}_2$ of the delay flip-flop 363 are connected to the inverter 382 to invert signals, and then transfer the signals to the third input ports QP2, QN2 of the third current mode logic buffer 28 respectively, to receive the third differential input signals. In this way, the first differential input signal, the second differential input signal, and the third differential input signal may also be generated using a serializer 14 of the data lane to be provided to the first current mode logic buffer 24, the second current mode logic buffer 26, and the third current mode logic buffer 28 respectively. Subsequent operations are the same as those in the foregoing embodiments, and details are not described herein again.

In summary, in the present invention, the current mode logic buffer device is utilized to redistribute a proportion of output signals, and a distribution delay of a differential input signal is combined, so that a rising time and a falling time of an output full clock signal increase, to generate an effect of approaching to a sine wave output, so as to reduce energy of a harmonic signal, especially an energy of a third harmonic in a clock frequency, thereby mitigating electromagnetic interference.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A current mode logic buffer device for suppressing electromagnetic interference, comprising:
   a first current mode logic buffer having two first input ports, the first current mode logic buffer generating a first clock signal in response to a first differential input signal received by the two first input ports;
   a second current mode logic buffer having two second input ports, the second current mode logic buffer generating a second clock signal in response to a second differential input signal received by the two second input ports, and the second differential input signal being delayed by a time difference from the first differential input signal;
   a third current mode logic buffer having two third input ports, the third current mode logic buffer generating a third clock signal in response to a third differential input signal received by the two third input ports, and the third differential input signal being delayed by the time difference from the second differential input signal; and
   two output ports, receiving the first clock signal, the second clock signal, and the third clock signal and outputting a full clock signal;
   wherein the first current mode logic buffer comprises:
      two first load resistors separately connected to a voltage supply terminal;
      two first transistors, a drain of each of the first transistors being separately connected to one of the first load resistors and one of the output ports, and a gate of each of the first transistors being separately connected to one of the first input ports; and
      a first current source connected to sources of the two first transistors to provide a first bias current;
   wherein the second current mode logic buffer comprises:
      two second load resistors separately connected to the voltage supply terminal;
      two second transistors, a drain of each of the second transistors being separately connected to one of the second load resistors and one of the output ports, and a gate of each of the second transistors being separately connected to one of the second input ports; and
      a second current source connected to sources of the two second transistors to provide a second bias current; and
   wherein the third current mode logic buffer comprises:
      two third load resistors separately connected to the voltage supply terminal;
      two third transistors, a drain of each of the third transistors being separately connected to one of the third load resistors and one of the output ports, and a gate of each of the third transistors being separately connected to one of the third input ports; and
      a third current source connected to sources of the two third transistors to provide a third bias current.

2. The current mode logic buffer device for suppressing electromagnetic interference according to claim 1, wherein the first differential input signal, the second differential input signal, and the third differential input signal are from a serializer in a transfer device of a high-speed transmission interface.

3. The current mode logic buffer device for suppressing electromagnetic interference according to claim 1, wherein a voltage level ratio of the first clock signal to the second clock signal to the third clock signal is equal to a ratio of the first bias current to the second bias current to the third bias current.

4. The current mode logic buffer device for suppressing electromagnetic interference according to claim 3, wherein the voltage level ratio of the first clock signal to the second clock signal to the third clock signal is 1:2:1.

5. The current mode logic buffer device for suppressing electromagnetic interference according to claim 1, wherein the voltage level ratio of the first clock signal to the second clock signal to the third clock signal is 1:2:1.

6. The current mode logic buffer device for suppressing electromagnetic interference according to claim 1, wherein the time difference is $\frac{1}{10}$ of a cycle of the full clock signal.

7. A signal generating method for suppressing electromagnetic interference, used for a current mode logic buffer device, the signal generating method comprising:
   receiving a first differential input signal, and generating a first clock signal in response to the first differential input signal;
   receiving a second differential input signal after a time difference, and generating a second clock signal in response to the second differential input signal;
   receiving a third differential input signal after the time difference, and generating a third clock signal in response to the third differential input signal; and
   receiving the first clock signal, the second clock signal and the third clock signal to output a full clock signal;
   wherein a voltage level ratio of the first clock signal to the second clock signal to the third clock signal is 1:2:1.

8. The signal generating method for suppressing electromagnetic interference according to claim 7, wherein the first differential input signal, the second differential input signal and the third differential input signal are from a serializer in a transfer device of a high-speed transmission interface.

9. The signal generating method for suppressing electromagnetic interference according to claim 7, wherein the time difference is $\frac{1}{10}$ of a cycle of the full clock signal.

* * * * *